United States Patent
Murray et al.

(10) Patent No.: US 10,545,409 B1
(45) Date of Patent: Jan. 28, 2020

(54) DYNAMIC ADJUSTMENT OF POST EXPOSURE BAKE DURING LITHOGRAPHY UTILIZING REAL-TIME FEEDBACK FOR WAFER EXPOSURE DELAY

(71) Applicant: International Business Machines Corporation, Armonk, NY (US)

(72) Inventors: Cody John Murray, Scotia, NY (US); Ekmini Anuja De Silva, Slingerlands, NY (US); Alex Richard Hubbard, Rensselaer, NY (US); Karen Elizabeth Petrillo, Voorheesville, NY (US); Nelson Felix, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/426,805

(22) Filed: May 30, 2019

(51) Int. Cl.
*G03F 7/40* (2006.01)
*G03F 7/38* (2006.01)
*H01L 21/027* (2006.01)

(52) U.S. Cl.
CPC ............. *G03F 7/40* (2013.01); *G03F 7/38* (2013.01); *H01L 21/0274* (2013.01)

(58) Field of Classification Search
CPC ........... G03F 7/70991; G03F 7/70558; G03F 7/70466; G03F 7/70425; G03F 7/40; G03F 7/38
USPC ..................................... 355/27–30
See application file for complete search history.

(56) References Cited

U.S. PATENT DOCUMENTS

| | | | |
|---|---|---|---|
| 5,342,734 | A | 8/1994 | Lazarus et al. |
| 5,626,782 | A | 5/1997 | Maeda |
| 6,987,572 | B2 | 1/2006 | Lakkapragada et al. |
| 7,186,486 | B2 | 3/2007 | Walford et al. |
| 7,334,202 | B1 | 2/2008 | Singh et al. |
| 7,493,186 | B2 | 2/2009 | Brodsky et al. |
| 2006/0154479 | A1 | 7/2006 | Lee |
| 2006/0222975 | A1 | 10/2006 | Ke et al. |
| 2008/0241760 | A1* | 10/2008 | Lee ............... G03F 7/70991 430/322 |
| 2009/0230115 | A1* | 9/2009 | Shino ................ G03F 7/40 219/412 |

(Continued)

FOREIGN PATENT DOCUMENTS

| | | |
|---|---|---|
| JP | 2005101077 A | 4/2005 |
| KR | 19990066582 A | 8/1999 |
| KR | 20060006245 A | 1/2006 |

OTHER PUBLICATIONS

"Method to Control Image Size Uniformity in High Contrast Photoresist", IBM TDB 01-88 p. 331-332, IPCOM000056694D, Feb. 14, 2005.

(Continued)

*Primary Examiner* — Hung Nguyen
(74) *Attorney, Agent, or Firm* — Fleit Intellectual Property Law; Thomas S. Grzesik

(57) ABSTRACT

A method of optimizing a lithographic process for semiconductor fabrication includes determining that a semiconductor wafer experienced a photoresist exposure delay. At least one operating parameter of a post exposure baking process is adjusted based on the semiconductor wafer having experienced the photoresist exposure delay. The post exposure baking process is performed on the semiconductor wafer utilizing the adjusted at least one operating parameter.

17 Claims, 6 Drawing Sheets

(56) References Cited

U.S. PATENT DOCUMENTS

| | | | |
|---|---|---|---|
| 2009/0275149 A1 | 11/2009 | Michaelson et al. | |
| 2010/0104959 A1 | 4/2010 | Vangheluwe et al. | |
| 2010/0279213 A1* | 11/2010 | Levy | G01B 11/24 430/30 |
| 2014/0347643 A1* | 11/2014 | Kotoku | G03F 7/70558 355/52 |

OTHER PUBLICATIONS

Young-Mi Lee et al., "Post Exposure Delay Consideration in a 193-nm Chemically Amplied Resist", Journal of the Korean Physical Society, vol. 38, No. 3, pp. 255-258 Mar. 2001.

\* cited by examiner

US 10,545,409 B1

DYNAMIC ADJUSTMENT OF POST EXPOSURE BAKE DURING LITHOGRAPHY UTILIZING REAL-TIME FEEDBACK FOR WAFER EXPOSURE DELAY

BACKGROUND OF THE INVENTION

The present invention generally relates to the field of semiconductor processing, and more particularly relates to optimizing post exposure bake processes for semiconductor device fabrication.

Lithography, in the context of building integrated circuits (ICs) such as microprocessors and memory chips, is a highly specialized printing process used to put detailed patterns onto silicon wafers. An image containing the desired pattern is projected onto the wafer through a mask defining the pattern. Prior to light projection through the mask, the wafer is coated with a thin layer of photosensitive material called "resist". The resist material may then be pre-baked to drive-off excess solvent. After the pre-baking process, the wafer is exposed to one or more patterns of light. For positive-tone photoresists, the bright parts of the image pattern cause chemical reactions that result in the resist material becoming more soluble, and thus dissolve away in a developer liquid; the dark portions of the image remaining insoluble. For negative-tone resists, the exposed (bright image parts) photoresist remains after development.

A post exposure bake (PEB) is then performed to help reduce standing wave effects caused by the destructive/constructive interference patterns of the incident light during the exposure process. The PEB process may also thermally catalyze chemical reactions and increase resolution and line width. Once the PEB process has completed, a development process is performed where the desired portions of the resist material are removed. A baking process may then be performed to solidify the remaining resist material. After development, the resist forms a stenciled pattern across the wafer surface which accurately matches the desired mask pattern. Finally, the pattern is permanently transferred onto the wafer surface in an etching process wherein, for example, a chemical etchant is used to etch the portions of the wafer surface not protected by resist.

SUMMARY OF THE INVENTION

In one embodiment, a method optimizing a lithographic process for semiconductor fabrication comprises determining that a semiconductor wafer experienced a photoresist exposure delay. At least one operating parameter of a post exposure baking process is adjusted based on the semiconductor wafer having experienced the photoresist exposure delay. The post exposure baking process is performed on the semiconductor wafer utilizing the adjusted at least one operating parameter.

In another embodiment, a system for optimizing a lithographic process for semiconductor fabrication comprises memory, one or more processors, and at least one controller. The at least one controller is configured to perform a method comprising determining that a semiconductor wafer experienced a photoresist exposure delay. At least one operating parameter of a post exposure baking process is adjusted based on the semiconductor wafer having experienced the photoresist exposure delay. The post exposure baking process is performed on the semiconductor wafer utilizing the adjusted at least one operating parameter.

In a further embodiment, a computer program product for optimizing a lithographic process for semiconductor fabrication comprises a non-transitory storage medium, readable by a processing circuit and storing instructions for execution by the processing circuit for performing a method. The method comprises determining that a semiconductor wafer experienced a photoresist exposure delay. At least one operating parameter of a post exposure baking process is adjusted based on the semiconductor wafer having experienced the photoresist exposure delay. The post exposure baking process is performed on the semiconductor wafer utilizing the adjusted at least one operating parameter.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
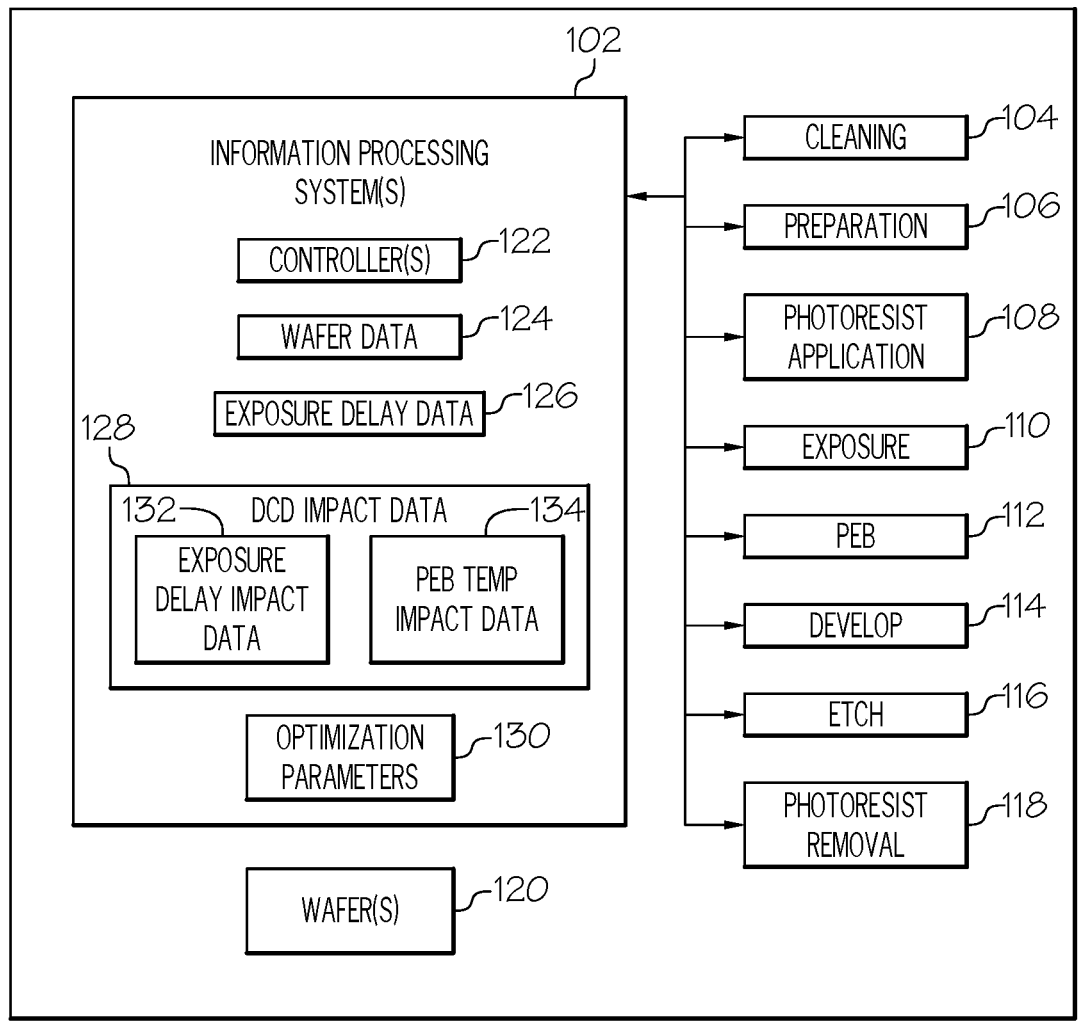
FIG. 1 is a block diagram illustrating a system for optimizing a lithographic process for semiconductor fabrication according one embodiment of the present invention.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

As semiconductor manufacturing technology node goes beyond 7 nm, developed critical dimension issues become more prevalent and difficult to overcome. Developed critical dimension (DCD or CD) herein refers to the printed feature size post lithography. The inventors have found that one main cause of CD issues is due to the breakdown, destabilization, and/or desensitization of the photoresist material applied to the wafer resulting from the delay between resist application and exposure. A wafer may experience undesirable exposure delay times as a result of a work-in-progress backlog (due to the speed of the exposure process), dose instabilities, tool issues, and/or the like. Photoresist materials have high sensitivities and the longer a wafer waits to be exposed the less sensitive the resist may become to the exposure dose, which negatively affects the target CD of the wafer.

As will be discussed in greater detail below, embodiments of the present invention overcome the above problems by implementing a real-time feedback loop for updating PEB temperature (and/or time) based on the delay time between resist coating (or resist bake) to exposure. One or more embodiments obtain and utilize a dose slope that is particular to the resist of a given wafer and further obtain the delay time associated with the given wafer. The PEB temperature and/or time may then be dynamically adjusted based on this data to offset any undesirable shift away from the target CD induced by the delay time.

For example, one or more embodiments provide a method for optimizing a lithographic process for semiconductor fabrication. The method may comprise determining that a semiconductor wafer experienced a photoresist exposure delay. At least one operating parameter of a post exposure baking process is adjusted based on the semiconductor wafer having experienced the photoresist exposure delay. The at least one operating parameter may comprise temperature and/or baking time. The post exposure baking process is performed on the semiconductor wafer utilizing the adjusted at least one operating parameter.

Determining that the semiconductor wafer experienced the photoresist exposure delay may comprise monitoring a time interval between application of a photoresist material to the semiconductor wafer and exposure of the photoresist material. The photoresist exposure delay shifts an actual developed critical dimension (DCD) of the semiconductor wafer away from a target DCD for the semiconductor wafer. Performing the post exposure baking process on the semiconductor wafer utilizing the adjusted at least one operating parameter offsets the shift caused by the photoresist exposure delay.

In one or more embodiments, the method may further comprise determining that an expected developed critical dimension (DCD) of the semiconductor wafer resulting from the photoresist exposure delay time fails to satisfy a DCD threshold. The at least one operating parameter may be adjusted based on the expected DCD failing to satisfy the DCD threshold. Adjusting at least one operating parameter may comprise processing a first set of DCD impact data indicating how photoresist exposure delays impact a DCD of a semiconductor wafer, and processing a second set of impact DCD data indicating how post exposure back temperatures impact a DCD of a semiconductor wafer without any photoresist exposure delay. Adjusting the at least one operating parameter may further comprise determining, based on the first set of DCD impact data, an expected DCD resulting from the photoresist exposure delay; determining a delta between the expected DCD and a target DCD for the semiconductor wafer; and determining, based on the second set of impact DCD data, a new operating temperature for the post exposure bake process to offset the delta.

Accordingly, embodiments of the present invention are able to prevent or at least correct CD issues that may arise from resist material degradation/defects caused by undesirable exposure delay time. In addition, embodiments of the present invention prevent the wafers from having to be reworked due to long exposure delays, which can be very expensive, since the PEB temperature and/or time may be adjusted to account for the delays.

Referring now to the drawings in which like numerals represent the same of similar elements, FIG. 1 illustrates a block diagram of a lithography system/apparatus 100 according to one or more embodiments. In one embodiment, the lithography system 100 is a patterning system comprising at least one or more information processing systems 102, patterning stations/components 104 to 118, and semiconductor wafers 120. The information processing system 102 may control the one or more patterning stations and their components. In one embodiment, the information processing system 102 may comprise at least one controller 122 that may be part of one or more processors or may be a component that is separate and distinct from the processor(s) of the information processing system 102. The information processing system 102 may further comprise wafer data 124, wafer exposure delay data 126, CD impact data 128, and PEB optimization parameters/data 130. The DCD impact data 128, in some embodiments, may comprise exposure delay impact data 132, PEB temperature impact data 134, and/or the like. Each of these components is discussed in greater detail below.

The one or more patterning stations may include a cleaning station 104, a preparation station 106, a photoresist application station 108, an exposure station 110, a post exposure bake (PEB) station 112, a developing station 114, an etching station 116, and a photoresist removal station 118. In some embodiments, two or more of these stations are separate from each other where the semiconductor wafer 120 is moved from one station to a different station after processing. However, in other embodiments, two or more of these stations may be combined into a single station. In addition, one or more of the stations/components 104 to 118 may not be a physical station per se, but may refer to a patterning process(es) performed by the system 100.

In one embodiment, the cleaning station/process 104 removes contaminants from the surface of the semiconductor wafer 120 using, for example, a wet chemical treatment. The preparation station/process 106, in one embodiment, removes any unwanted moisture from the surface of the semiconductor wafer 120 and may apply an adhesion promoter to the surface of the semiconductor wafer 120. The photoresist application station/process 108, in one embodiment, forms a layer of photoresist material on the surface of semiconductor wafer 120 (or the adhesion promoter layer if formed). A process such as, but not limited to, spin coating may be used to form the photoresist layer. This process may include direct application of the photoresist (PR) material or the use of more complex stacks such as trilayer (e.g., from bottom to top: OPL, SiARC/SiOx, PR). Excess photoresist solvent may be removed by pre-baking the coated semiconductor wafer 120.

The exposure station/process 110, in one embodiment, exposes the photoresist coated semiconductor wafer 120 to one or more patterns of light. The patterns may be formed by projecting the light through a mask. The bright parts of the image pattern cause chemical reactions, which result in one of the following situations depending on the type of resist material being used. Exposed positive-tone resist material becomes more soluble so that it may be dissolved in a developer liquid, and the dark portions of the image remain insoluble. Exposed negative-tone resist material becomes less soluble so that it may not be dissolved in a developer liquid, and the dark portions of the image remain soluble.

The PEB station/process 112, in one embodiment, subjects the semiconductor wafer 120 to heat for a given period of time after the exposure process. In some embodiments, the PEB performs and completes the exposure reaction. The PEB process may also reduce mechanical stress formed during the exposure process. In one embodiment, the PEB station/process 112 comprises a hot plate on which the semiconductor wafer 120 is placed. The hot plate applies heat across the entire semiconductor wafer 120.

The develop station/process 114, in one embodiment, subjects the semiconductor wafer 120 to one or more develop solutions after the post exposure bake. The develop solution(s) dissolves away the exposed portions of the photoresist. After development, the remaining photoresist forms a stenciled pattern across the wafer surface, which accurately matches the desired mask pattern. The etch station/process 116, in one embodiment, subjects the semiconductor wafer 120 to wet or dry chemical agents to remove one or more layers of the wafer 120 not protected by the photoresist pattern. The photoresist removal station/process 118, in one embodiment, removes the remaining photoresist material after the etching process. The photoresist material may be removed by one or more processes such as (but not limited to) chemical stripping, ashing, etc. It should be noted that the lithography system 100 is not limited to the stations/processes discussed above. In some embodiments, one or more of the stations/processes 104 to 118 may be removed from the system 100 and/or additional stations/processes may be added.

Figure 2:
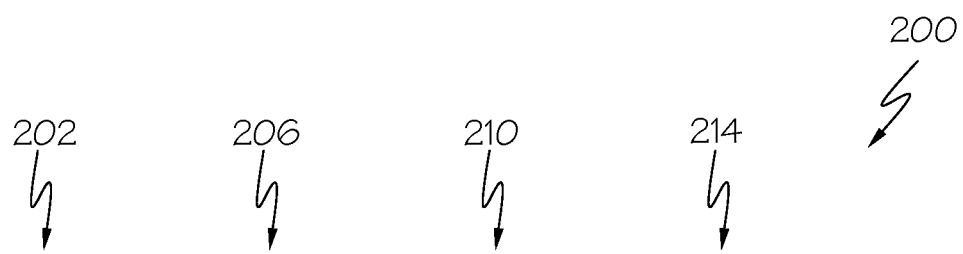
FIG. 2 is a table showing one example of lithographic wafer data according one embodiment of the present invention.

The wafer data 124, in some embodiments, may comprise data associated with one or more of the semiconductor wafers 120 being processed by the lithography system 100. The wafer data 124 may be used by the information processing system 102 and/or components of the lithography system 100 to monitor/track and process the semiconductor wafers 120 during lithography. FIG. 2 shows one example of the wafer data 124. In this example, the wafer data 124 is represented as a table 200 comprising a plurality of rows and columns. However, other mechanisms for storing the wafer data 124 are applicable as well. Also, embodiments of the present invention are not limited to the types of data shown in FIG. 2 as additional types of data may be included or removed from the example shown in FIG. 2.

In the example shown in FIG. 2, each row represents a single semiconductor wafer record, while each column represents a specific attribute/characteristic of the semiconductor wafers. In this example, a first column 202 entitled "Wafer ID" comprises entries 204 indicating a unique identifier for each semiconductor wafer 120 being processed (and optionally previously processed) by the lithography system 100. A second column 206 entitled "Stage" comprises entries 208 indicating a current processing state/stage of the corresponding semiconductor wafer 120. This state may indicate the particular station that the wafer is at or has been most recently processed by; if the wafer is waiting to be processed; if the wafer has completed processing, and/or the like. A third column 210 entitled "Photoresist" comprises entries 212 identifying the type of photoresist material(s) applied to corresponding semiconductor structure 120. A fourth column 214 entitled "Delay Time" comprises entries 216 including the delay time data 126 discussed above. It should be noted that one or more of the types of data shown in FIG. 2 may be stored separately from the wafer data 124.

The DCD impact data 128 may comprise data indicating, for a given photoresist material (or type), how the DCD is impacted by PEB temperature (and/or time) and exposure delay. Different photoresist materials (or types) may each have their own associated DCD impact data 128. In some embodiments, the DCD impact data 128 comprises exposure delay impact data 132 and PEB temperature impact data 134. The exposure delay impact data 132 may indicate how exposure delay for the given photoresist material affects the DCD of the wafer. The PEB temperature impact data 134 may indicate how PEB temperature (and/or time) affects the DCD of the wafer under ideal conditions (e.g., without exposure delay). In one embodiment, the DCD impact data 128 for different photoresist materials (or types) may be obtained using measurement data taken during lithographic processing of previous semiconductor wafers; may be modeled/simulated; may be a combination of both; and/or the like.

For example, various lithographic processing data may be stored for each wafer as wafer data 124 (or other types of data). This data may include the exposure delay time, indication of photoresist material type, measured DCD, PEB temperature and time, and/or the like. This wafer data 124 may be measured and collected for each processed wafer. The information processing system 102 may then process and analyze this wafer data 124 to determine how different exposure times for different types of photoresist materials affect the DCD. In another example, semiconductor wafers 120 may be immediately placed within exposure station 110 so that measurements may be taken and data collected with respect to how PEB temperature (and/or time) affects the DCD of the wafer under ideal conditions (e.g., without exposure delay). Alternatively, or in addition to, the effect of exposure delay on DCD and the effect of PEB temperature (and/or time) on DCD under ideal conditions may be simulated/modeled based on the characteristics of the photoresist material of interest, the PEB process, and/or the like.

Figure 3:
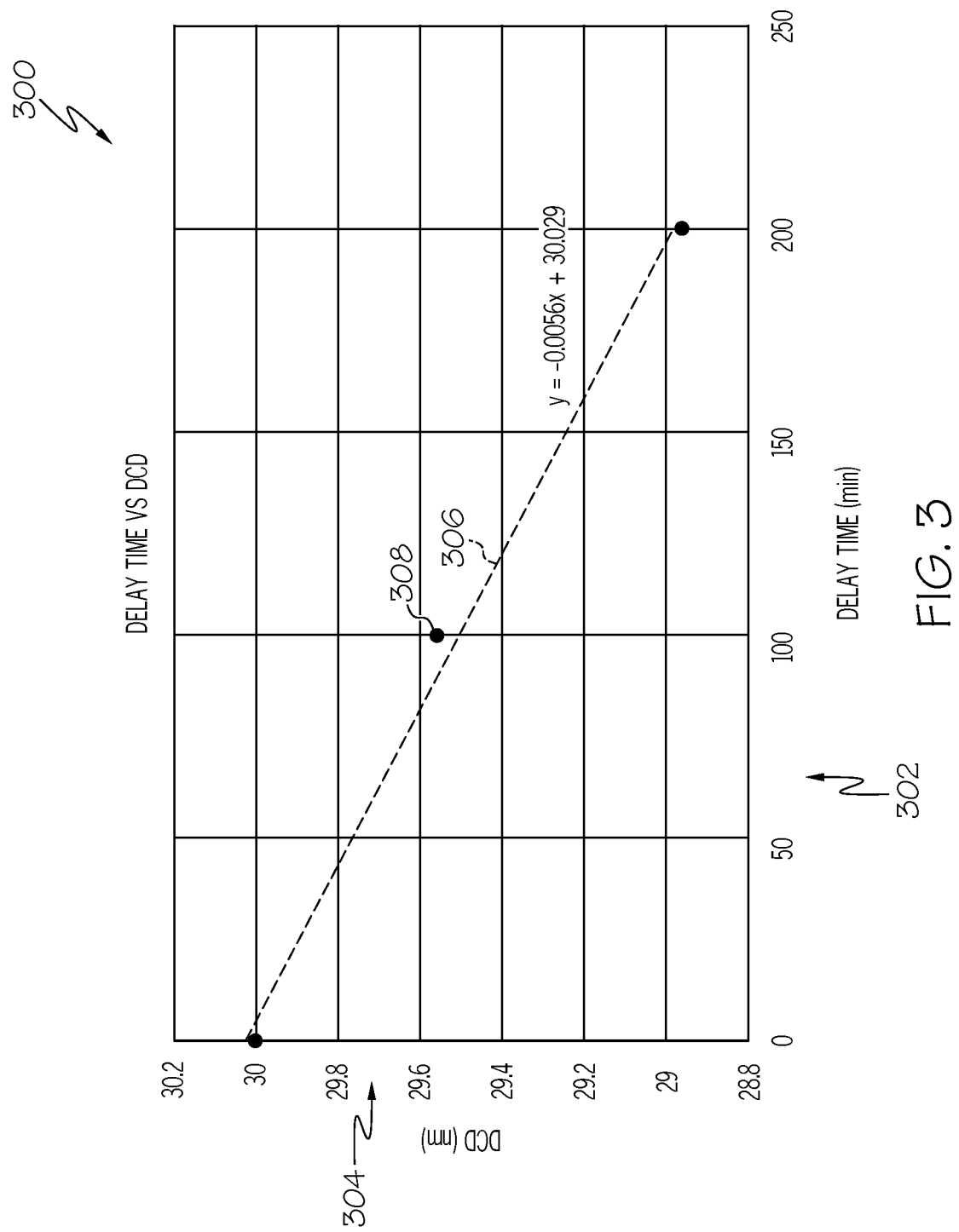
FIG. 3 is a graph showing one example of the impact of photoresist exposure delay on the developed critical dimension of a semiconductor wafer according one embodiment of the present invention.

FIG. 3 shows one example of exposure delay impact data 132 for a given photoresist material (or type). In this example, the exposure delay impact data 132 is represented as a Delay Time(t) vs DCD Shift reference chart 300 comprising information indicating how exposure delay time for the given photoresist material affects DCD. Although this data is represented as a chart/graph in FIG. 3, embodiments of the presentation are not limited to such a representation. The chart 300 of FIG. 3 comprises an X-axis 302 having exposure delay time values, a Y-axis 304 having DCD values, and a corresponding linear trend line 306. Each point 308 in the chart 300 indicates a mean DCD for a given exposure delay time. In the example shown in FIG. 3 as the exposure delay time increases for the given photoresist material associated with the chart 300 the DCD also increases.

Figure 4:
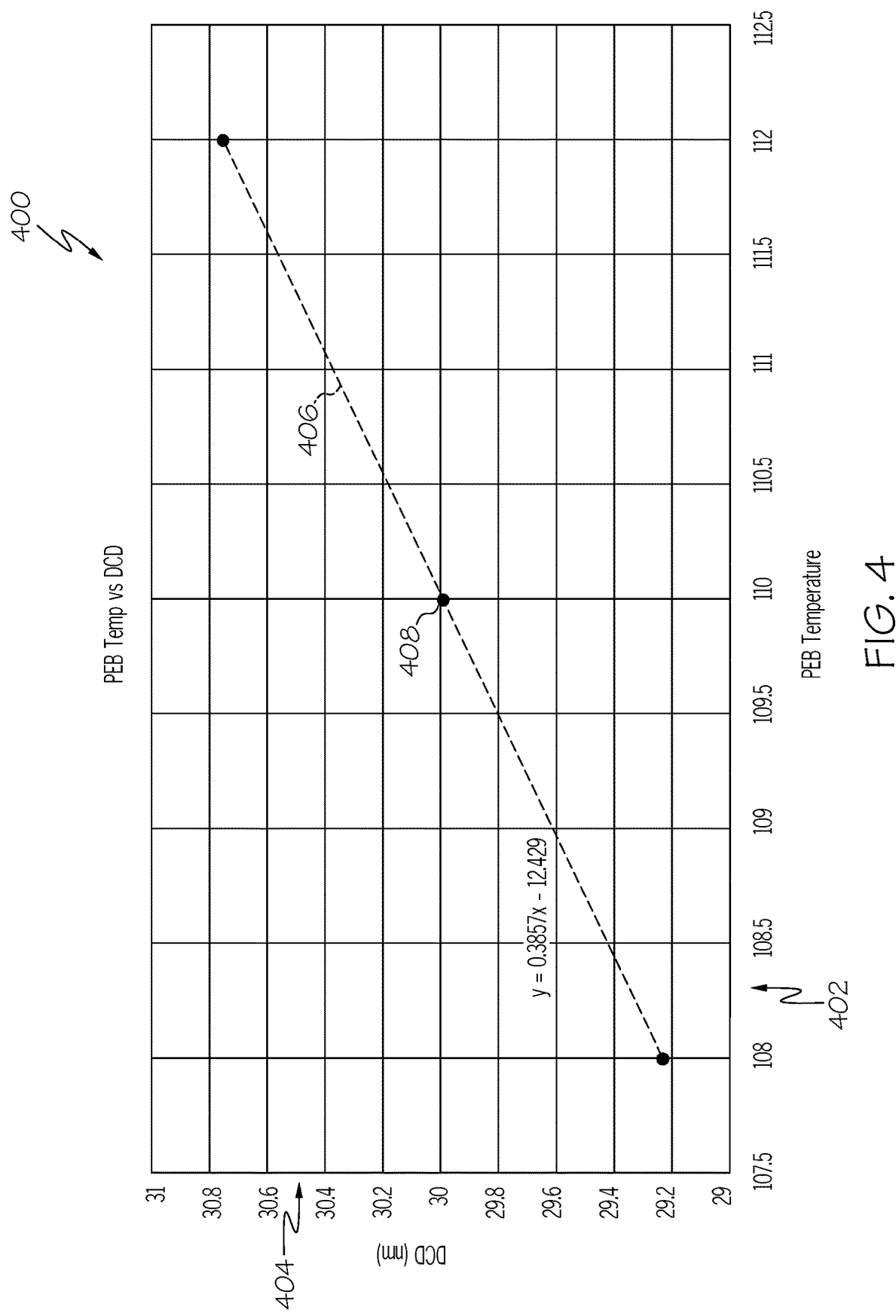
FIG. 4 is a graph showing one example of the impact of post exposure bake temperature on the developed critical dimension of a semiconductor wafer according one embodiment of the present invention.

FIG. 4 shows one example of a PEB temperature impact data 134 for the given photoresist material (or type) associated with the exposure delay impact data 132 of FIG. 4. In this example, the PEB temperature impact data 134 is represented as a PEB Temperature vs DCD Shift reference chart 400 comprising information indicating how PEB temperature affects the DCD of the wafer under ideal conditions (e.g., without exposure delay) for the given photoresist material. Although this data is represented as a chart/graph in FIG. 4, embodiments of the presentation are not limited to such a representation. The chart 400 of FIG. 4 comprises an X-axis 402 having PEB temperature values, a Y-axis 404 having DCD values, and a linear trend line 406. Each point 408 in the chart 400 indicates a mean DCD for a PEB temperature. In the example shown in FIG. 4 as the PEB temperature increases the DCD also increases. In some embodiments, a similar chart/data may be obtained for PEB time where the effect of different PEB times (for one or more temperatures) on DCD is modeled.

Figure 5:
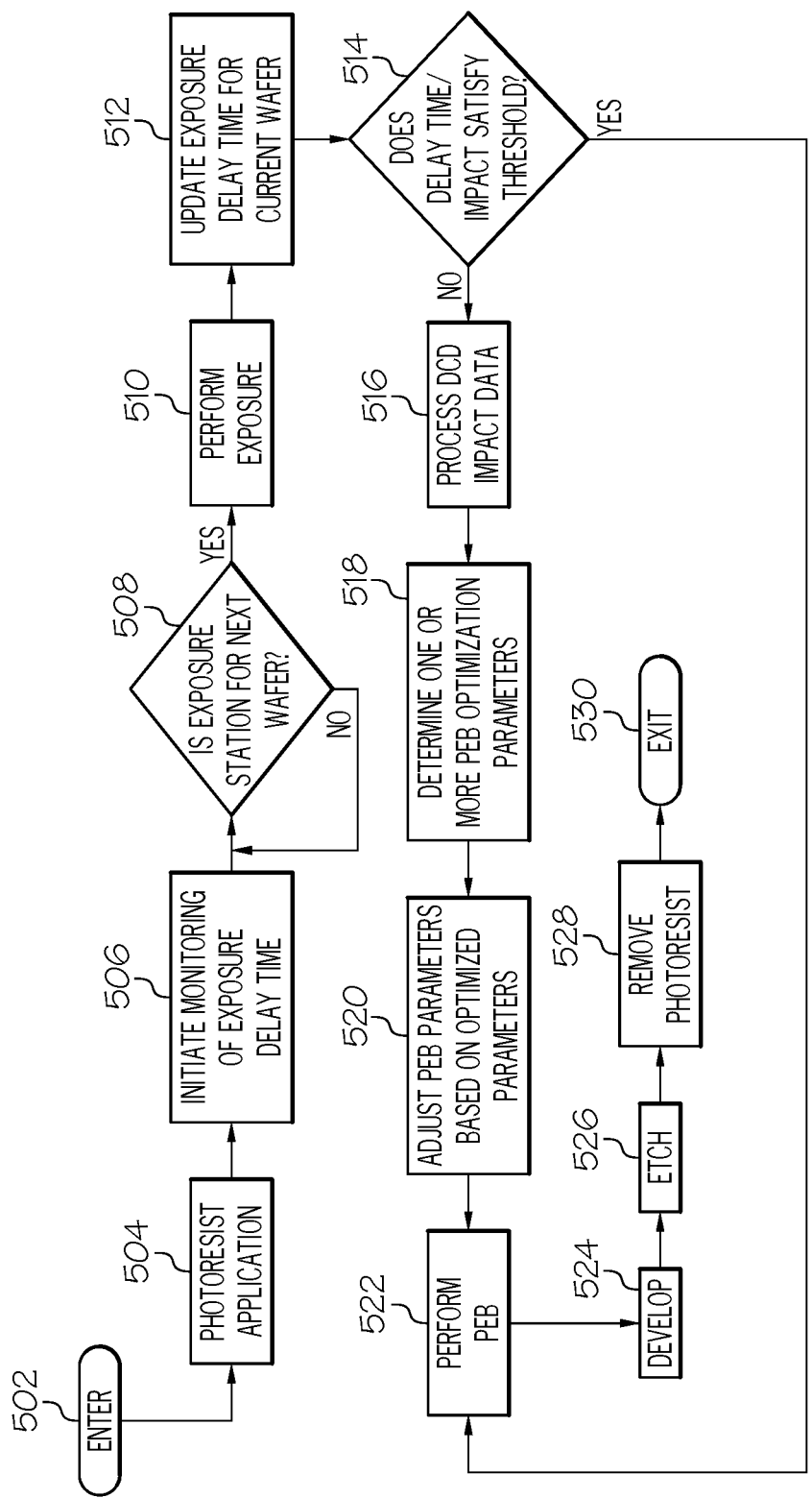
FIG. 5 is an operational flow diagram illustrating one example of a process for optimizing a lithographic process for semiconductor fabrication according one embodiment of the present invention.

FIG. 5 is an operational flow diagram illustrating one example of optimizing the PEB process to correct developed critical dimension issues (e.g., an undesirable shift away from target DCD) utilizing a real-time feedback loop for wafer exposure delay. The process flow of FIG. 5 begins at step 502, which is at a point in time after a semiconductor wafer 120 has been processed by the cleaning and preparation application stations 104, 106. It should be noted that two or more of the operations shown in FIG. 5 may be performed in parallel.

After a semiconductor wafer 120 has been cleaned and prepared, the controller 122 of the information processing system 102 initiates the photoresist application station 108 and a photoresist material(s) is applied to the semiconductor wafer 120 at step 504. A post application bake (PAB) may be performed to drive off excess photoresist solvent. After the photoresist material(s) has been applied (or after the PAB), the controller 122 may monitor the wafer exposure delay time 126, which is the time the semiconductor wafer 120 waits from photoresist application until the exposure process at step 506. For example, the controller 122 may initiate a timer, record a completion (or start) time of the photoresist application process, and/or the like. In some embodiments, the completion (and/or start) time of the photoresist process may be determined by the controller 122, sent to the controller 122 by a component of the photoresist application station 108, and/or the like. The exposure delay time data 126 may be stored separate from or as part of the wafer data 124.

After the semiconductor wafer 120 has been coated with the photoresist material(s) and monitoring of the exposure delay time has been initiated the controller 122 determines if the exposure station 110 is ready for the next semiconductor wafer 120 at step 508. If the result of this determination is negative, the controller 122 may process other semiconductor wafers and continue to monitor the exposure station 110 to determine when it is ready for the next wafer 120. If the controller 122 determines that the exposure station 110 is ready for the next semiconductor wafer 120, the controller 122 initiates the exposure station 110 and the wafer 120 is exposed to one or more patterns of light at step 510. The exposed portions of the photoresist material on the wafer 120 undergo a chemical reaction and become more soluble (in the case of positive-tone photoresist) or less soluble (in the case of negative-tone photoresist). The controller 122 updates/determines the exposure delay time data 126 at step 512 for the current wafer 120. For example, the controller updates/determines the exposure delay time data 126 for the current wafer 120 to indicate a start and/or stop time of the exposure process, a total delay time from photoresist application to the start/stop of the exposure process, and/or the like.

As discussed above, the exposure delay time of the semiconductor wafer 120 may adversely affect the target DCD of the wafer 120. For example, the longer the delay time between resist coating and exposure the less (or more) sensitive the photoresist material may become to the exposure dose. This may cause the resulting DCD (i.e., printed feature size post lithography) to shift from the target DCD beyond an acceptable threshold. Therefore, in one embodiment, after the exposure process has completed and prior to PEB being performed, the controller 122 at step 514 determines whether the exposure delay time (and/or its DCD impact) associated with the given wafer 120 satisfies a DCD impact threshold. It should be noted that the thresholds discussed herein may be configured in various ways such that satisfying the thresholds may cause the same action(s) to be performed as that in an embodiment where the threshold fails to be satisfied, and vice versa.

For example, in one embodiment, the controller 122 obtains/determines the exposure delay time associated with the given wafer 120. As discussed above, the controller 122 maintains exposure delay time data 126 for each semiconductor wafer 120 being processed by the lithography system 100. This data 126 may be stored as part of the wafer data 124 and/or may be stored separately. The exposure delay time data 126 may include the resist application time exposure start and/or stop time from which the exposure delay time may be calculated; the actual exposure delay time data 126 based on a timer; and/or the like. In some embodiments, each instance of exposure delay time data 126 may be associated with a unique identifier of its associated semiconductor wafer 120. The controller 122 is able to obtain the exposure delay time data 126 for the current semiconductor wafer 120 by identifying the exposure delay time data 126 associated with a unique identifier matching the unique identifier of the current semiconductor wafer 120. The controller 122 then utilizes this exposure delay time data 126 to determine the exposure delay time for the current semiconductor wafer 120.

The controller 122 may then determine whether the exposure delay time (and/or its expected DCD impact) for the current semiconductor wafer 120 satisfies (or fails to satisfy) one or more DCD impact thresholds. In some embodiments, the DCD impact threshold(s) may be particular to a given photoresist material or type of photoresist material. In other embodiments, the DCD impact threshold(s) may be common to two or more photoresist materials or types of photoresist materials. The DCD impact threshold may be a given delay time value or range of values (e.g., 0 to 5 seconds of delay); a percentage or specific DCD value(s) from the target DCD; a specific DCD value that the DCD resulting from the exposure delay (expected DCD) needs to be; a range of DCD values that the expected DCD needs to fail within, and/or the like. If the DCD impact threshold(s) is configured for a specific photoresist material (or type), the controller 122 may determine the photoresist material of the current semiconductor wafer 120 and then determine the DCD impact threshold corresponding to the photoresist material of the current wafer 120. In one embodiment, the controller 122 may determine the type of photoresist material applied to the current wafer 120 based on the wafer data 124 associated with the wafer 120.

In an embodiment where the expected DCD impact of the exposure delay is compared to the DCD impact threshold, the controller 122 may determine the expected DCD for the current semiconductor wafer 120 based on the exposure delay impact data 132 associated with the current wafer's photoresist material (or type). As discussed above, the exposure delay impact data 132 indicates an expected (or measured) DCD for wafers 120 having a given photoresist material and various exposure delay times, where different exposure delay impact data 132 is available or determined for different photoresist materials (or types). Therefore, the controller 122 may process the exposure delay impact data 132 for the current wafer's photoresist material (or type) to determine the expected DCD for the wafer 120 given its photoresist material and exposure delay time. For example, using the chart of FIG. 3, if the current wafer 120 had an exposure delay time 120 seconds the expected DCD ("expDCD") due to this delay may be calculated using the trend line 610 and the following Expected DCD calculation:

$$y=-0.0056x+30.029, \text{ where } y \text{ is expDCD and } x \text{ is DelayTime},$$

$$\text{expDCD}=-0.0056(\text{DelayTime})+30.029,$$

expDCD=−0.0056(120)+30.029, expDCD=29.36 nm.

The expected DCD may then be compared to the delay impact threshold to determine if the PEB parameters for the current wafer 120 need to be optimized/adjust to compensate for the expected DCD shift resulting from the exposure delay. If the controller 122 determines that the exposure delay time and/or its effect on the target DCD satisfies the DCD impact threshold, the control flows to step 522 where the controller 122 initiates the PEB station 112 without optimizing the PEB operating parameters and PEB processing is performed on the current wafer 120. If the controller 122 determines that the exposure delay time and/or its effect on the target DCD fails to satisfy the DCD impact threshold, the controller 122 processes DCD impact data 128 at step 518 for associated with the given photoresist material (or type) of the current wafer 120 and determines one or more PEB optimization parameters 130 (such as temperature and/or time) at step 520 based on processing the DCD impact data 128.

For example, if the controller 122 does not currently have the DCD impact data 128 associated with the given photoresist material (or type) of the current wafer 120 the controller 122 may obtain this data based on the unique ID of the wafer 120 as discussed above. The controller 122 may then utilize the DCD impact data 128 to determine, for example, a new PEB operating temperature and/or time for the current wafer 120 to shift the expected DCD resulting from the exposure delay back to the target DCD (or at least within a given threshold of the target DCD).

Consider an example where the exposure delay is 120 seconds and the target DCD is 30 nm with a nominal PEB operating temperature of 110 C. The controller 122 may determine from the exposure delay impact data 132 of FIG. 3 that the expected DCD is 29.36 nm based on the calculations discussed above. In this example, the exposure delay of 120 seconds shifted the DCD by 0.64 nm from the target DCD. Therefore, in one embodiment, the controller 122 determines a new PEB operating temperature (and/or time) to offset the 0.64 nm DCD shift such that the resulting DCD equals (or is at least within a given threshold of) the target DCD of 30 nm.

Using the example exposure delay impact data 132 of FIG. 3 in combination with the example PEB impact data of FIG. 4, the controller 122 may determine the new PEB operating temperature (and/or time) to offset the 0.64 nm DCD shift caused by the exposure delay. One example of a PEB optimization calculation utilizing the data of FIGS. 3 and 4 is as follows:

$y_{expDCD}=-0.0056x_{dt}+30.029$ where y is the expected DCD caused by exposure delay, and $x_{dt}$ is the delay time, $y_{targetDCD}=0.3857x_{PEB}-12.429$ where $y_{targetDCD}$ is the target DCD for the litho process, and $x_{PEB}$ is the PEB temperature to obtain the target DCD, $y_{DCDoffset}=y_{targetDCD}-y_{expDCD}$, $y_{adjustedDCD}=y_{targetDCD}+y_{DCDoffset}$ where $y_{adjustedDCD}$ is the new DCD to offset exposure delay impact given $x_{dt}$=120 seconds and $x_{PEB}$=110C:

$y_{expDCD}=-0.0056(120)+30.029=29.36$ nm $y_{targetDCD}=0.3857(110)-12.429=30.00$ nm $y_{DCDoffset}=30.00-29.36=0.64$ nm $y_{adjustedDCD}=30.00+0.64=30.64$ nm set $y_{adjustedDCD}=y_{targetDCD}$ and solve for $x_{PEB}$:

$y_{adjustedDCD}=0.3857x_{PEB}-12.429$, $30.64=0.3857x_{PEB}-12.429$, $$\frac{30.64+12.429}{0.3857}=x_{PEB}$$

$x_{PEB}=111.66$ C

Accordingly, in the above example, the controller 122 determines that the PEB operating temperature should be adjusted from 110 C to 111.66 C to offset the 0.64 nm DCD shift such that the resulting DCD equals (or is at least within a given threshold of) the target DCD of 30 nm.

After the controller 122 determines the optimization parameters 130, the controller 122 initiates the PEB station 112 with the optimization parameters 130 at step 520. The current wafer 120 is then processed by the PEB station at step 522 using optimized parameters such as temperature (and/or bake time) such that the negative effect of the exposure delay on the DCD is overcome. This process completes the exposure reaction. After PEB has been completed, the controller 122 initiates the developing station/process 114 at step 524. The develop station/process 114 subjects the semiconductor wafer 120 to one or more develop solutions after the post exposure bake. The develop solution(s) dissolves away the exposed portions of the photoresist. After the develop process, the photoresist material has been divided into multiple copies of patterned photoresist features.

The controller 122 then initiates the etching station/process 116 at step 526 where The wafer 120 is subjected to wet or dry chemical agents to remove one or more layers of the wafer 120 not protected by the photoresist pattern. After the etching process, the controller 122 initiates the photoresist removal station/process 118 at step 528 where the remaining photoresist material after the etching process. The control flow then exits at step 530 or returns to step 504.

Figure 6:
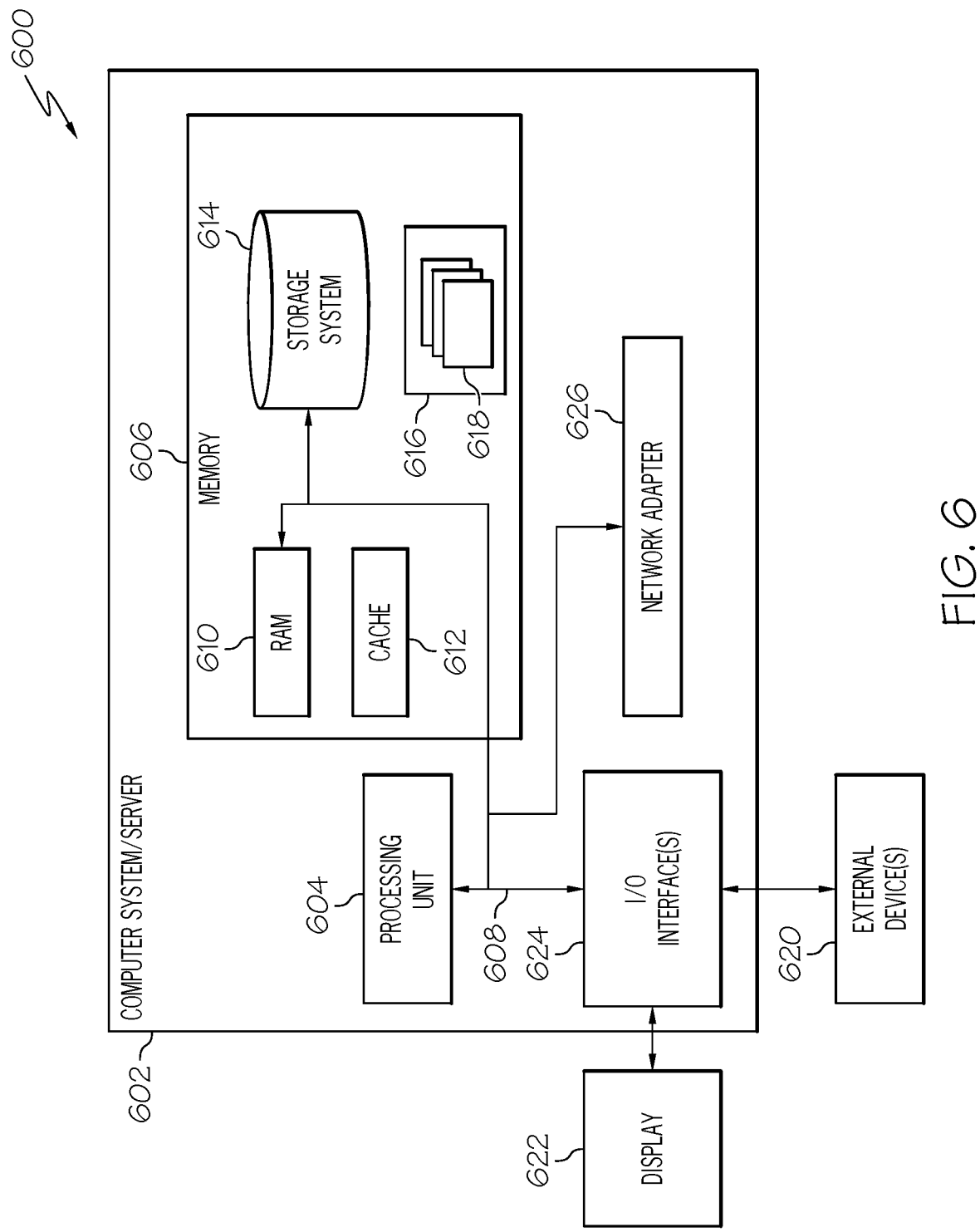
FIG. 6 is a block diagram illustrating one example of an information processing system according to one embodiment of the present invention.

FIG. 6 shows one example of a block diagram illustrating an information processing system that may be utilized in embodiments of the present invention. The information processing system 602 may be based upon a suitably configured processing system configured to implement one or more embodiments of the present invention such as the information processing system 102 of FIG. 1.

Any suitably configured processing system may be used as the information processing system 602 in embodiments of the present invention. The components of the information processing system 602 may include, but are not limited to, one or more processors or processing units 604, controllers 605 such as controller 122 of FIG. 1, a system memory 606, and a bus 608 that couples various system components including the system memory 606 to the processor 604. The bus 608 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Although not shown in FIG. 6, the main memory 606 may include the controller 122, wafer data 124, DCD impact data 128, PEB optimization parameters 130, etc. The controller 122 may reside within the processor 604, or be a separate hardware component. The system memory 606 may also include computer system readable media in the form of volatile memory, such as random access memory (RAM) 610 and/or cache memory 612. The information processing system 602 may further include other removable/non-removable, volatile/non-volatile computer system storage media. By way of example only, a storage system 614 may be provided for reading from and writing to a non-removable or removable, non-volatile media such as one or more solid state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to the bus 608 by one or more data media interfaces. The memory 606 may include at least one program product having a set of program modules that are configured to carry out the functions of an embodiment of the present invention.

Program/utility 616, having a set of program modules 618, may be stored in memory 606 by way of example, and not limitation, as well as an operating system, one or more application programs, other program modules, and program data. Each of the operating system, one or more application programs, other program modules, and program data or some combination thereof, may include an implementation of a networking environment. Program modules 618 generally carry out the functions and/or methodologies of embodiments of the present invention.

The information processing system 602 may also communicate with one or more external devices 620 such as a keyboard, a pointing device, a display 622, etc.; one or more devices that enable a user to interact with the information processing system 602; and/or any devices (e.g., network card, modem, etc.) that enable computer system/server 602 to communicate with one or more other computing devices. Such communication may occur via I/O interfaces 624. Still yet, the information processing system 602 can communicate with one or more networks such as a local area network (LAN), a general wide area network (WAN), and/or a public network (e.g., the Internet) via network adapter 626. As depicted, the network adapter 626 communicates with the other components of information processing system 602 via the bus 608. Other hardware and/or software components can also be used in conjunction with the information processing system 602. Examples include, but are not limited to: microcode, device drivers, redundant processing units, external disk drive arrays, RAID systems, tape drives, and data archival storage systems.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. The terminology used herein is for the purpose of describing particular embodiments only and is not intended to be limiting of the invention.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As will be appreciated by one skilled in the art, aspects of the present invention may be embodied as a system, method, or computer program product. Accordingly, various aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Python, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been discussed above with reference to flowchart illustrations and/or block diagrams of methods, apparatus (systems) and computer program products according to various embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Although specific embodiments have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A method of optimizing a lithographic process for semiconductor fabrication, the method comprising:
    determining that a semiconductor wafer experienced a photoresist exposure delay between application of a photoresist material to the semiconductor wafer and exposure of the photoresist material;
    adjusting at least one operating parameter of a post exposure baking process based on the semiconductor wafer having experienced the photoresist exposure delay, wherein adjusting at least one operating parameter comprises
        processing a first set of DCD impact data indicating how photoresist exposure delays impact a DCD of a semiconductor wafer; and
        processing a second set of impact DCD data indicating how post exposure back temperatures impact a DCD of a semiconductor wafer without any photoresist exposure delay; and
    performing the post exposure baking process on the semiconductor wafer utilizing the adjusted at least one operating parameter.

2. The method of claim 1, wherein the at least one operating parameter comprises temperature and/or baking time.

3. The method of claim 1, wherein determining that the semiconductor wafer experienced the photoresist exposure delay comprises:
    monitoring a time interval between application of the photoresist material to the semiconductor wafer and exposure of the photoresist material.

4. The method of claim 1, wherein the photoresist exposure delay shifts an actual developed critical dimension (DCD) of the semiconductor wafer away from a target DCD for the semiconductor wafer, and wherein performing the post exposure baking process on the semiconductor wafer utilizing the adjusted at least one operating parameter offsets the shift caused by the photoresist exposure delay.

5. The method of claim 1, further comprising:
    determining that an expected developed critical dimension (DCD) of the semiconductor wafer resulting from the photoresist exposure delay time fails to satisfy a DCD threshold,
    wherein the at least one operating parameter is adjusted based on the expected DCD failing to satisfy the DCD threshold.

6. The method of claim 1, wherein adjusting at least one operating parameter further comprises:
    determining, based on the first set of DCD impact data, an expected DCD resulting from the photoresist exposure delay;
    determining a delta between the expected DCD and a target DCD for the semiconductor wafer; and
    determining, based on the second set of impact DCD data, a new operating temperature for the post exposure bake process to offset the delta.

7. A system for optimizing a lithographic process for semiconductor fabrication, the system comprising:
   memory;
   one or more processors; and
   at least one controller configured to perform a method comprising
      determining that a semiconductor wafer experienced a photoresist exposure delay between application of a photoresist material to the semiconductor wafer and exposure of the photoresist material;
      adjusting at least one operating parameter of a post exposure baking process based on the semiconductor wafer having experienced the photoresist exposure delay, wherein adjusting at least one operating parameter comprises
         processing a first set of DCD impact data indicating how photoresist exposure delays impact a DCD of a semiconductor wafer; and
         processing a second set of impact DCD data indicating how post exposure back temperatures impact a DCD of a semiconductor wafer without any photoresist exposure delay; and
      performing the post exposure baking process on the semiconductor wafer utilizing the adjusted at least one operating parameter.

8. The system of claim 7, wherein the at least one operating parameter comprises temperature and/or baking time.

9. The system of claim 7, wherein the photoresist exposure delay shifts an actual developed critical dimension (DCD) of the semiconductor wafer away from a target DCD for the semiconductor wafer, and wherein performing the post exposure baking process on the semiconductor wafer utilizing the adjusted at least one operating parameter offsets the shift caused by the photoresist exposure delay.

10. The system of claim 7, wherein the method performed by the at least one controller further comprises:
   determining that an expected developed critical dimension (DCD) of the semiconductor wafer resulting from the photoresist exposure delay time fails to satisfy a DCD threshold,
   wherein the at least one operating parameter is adjusted based on the expected DCD failing to satisfy the DCD threshold.

11. The method of claim 7, wherein adjusting at least one operating parameter further comprises:
   determining, based on the first set of DCD impact data, an expected DCD resulting from the photoresist exposure delay;
   determining a delta between the expected DCD and a target DCD for the semiconductor wafer; and
   determining, based on the second set of impact data, a new operating temperature for the post exposure bake process to offset the delta.

12. A computer program product for optimizing a lithographic process for semiconductor fabrication, the computer program product comprising:
   a non-transitory storage medium, readable by a processing circuit and storing instructions for execution by the processing circuit for performing a method comprising:
      determining that a semiconductor wafer experienced a photoresist exposure delay between application of a photoresist material to the semiconductor wafer and exposure of the photoresist material;
      adjusting at least one operating parameter of a post exposure baking process based on the semiconductor wafer having experienced the photoresist exposure delay, wherein adjusting at least one operating parameter comprises
         processing a first set of DCD impact data indicating how photoresist exposure delays impact a DCD of a semiconductor wafer; and
         processing a second set of impact DCD data indicating how post exposure back temperatures impact a DCD of a semiconductor wafer without any photoresist exposure delay; and
      performing the post exposure baking process on the semiconductor wafer utilizing the adjusted at least one operating parameter.

13. The computer program product of claim 12, wherein the at least one operating parameter comprises temperature and/or baking time.

14. The computer program product of claim 12, wherein determining that the semiconductor wafer experienced the photoresist exposure delay comprises:
   monitoring a time interval between application of the photoresist material to the semiconductor wafer and exposure of the photoresist material.

15. The computer program product of claim 12, wherein the photoresist exposure delay shifts an actual developed critical dimension (DCD) of the semiconductor wafer away from a target DCD for the semiconductor wafer, and wherein performing the post exposure baking process on the semiconductor wafer utilizing the adjusted at least one operating parameter offsets the shift caused by the photoresist exposure delay.

16. The computer program product of claim 12, wherein the method further comprises
   determining that an expected developed critical dimension (DCD) of the semiconductor wafer resulting from the photoresist exposure delay time fails to satisfy a DCD threshold,
   wherein the at least one operating parameter is adjusted based on the expected DCD failing to satisfy the DCD threshold.

17. The computer program product of claim 12, wherein adjusting at least one operating parameter further comprises:
   determining, based on the first set of DCD impact data, an expected DCD resulting from the photoresist exposure delay;
   determining a delta between the expected DCD and a target DCD for the semiconductor wafer; and
   determining, based on the second set of impact data, a new operating temperature for the post exposure bake process to offset the delta.

* * * * *